United States Patent
Miwa

[11] Patent Number: 5,955,775
[45] Date of Patent: Sep. 21, 1999

[54] STRUCTURE OF COMPLEMENTARY BIPOLAR TRANSISTORS

[75] Inventor: Hiroyuki Miwa, Kanagawa, Japan

[73] Assignee: Sony Corporation, Tokyo, Japan

[21] Appl. No.: 08/501,634

[22] Filed: Jul. 12, 1995

[30] Foreign Application Priority Data

Jul. 12, 1994 [JP] Japan .................................. 6-159732

[51] Int. Cl.⁶ ..................... H01C 29/00; H01C 27/082; H01C 27/102
[52] U.S. Cl. ...................... 257/587; 257/588; 257/511
[58] Field of Search .................. 257/511, 525, 257/587, 588

[56] References Cited

U.S. PATENT DOCUMENTS

| | | | |
|---|---|---|---|
| 4,609,568 | 9/1986 | Koh et al. | 427/85 |
| 4,764,480 | 8/1988 | Vora | 437/31 |
| 4,980,748 | 12/1990 | Hozumi et al. | 257/581 |
| 4,984,053 | 1/1991 | Kayanuma | 257/592 |
| 4,994,881 | 2/1991 | Gomi | 257/587 |
| 5,163,178 | 11/1992 | Gomi et al. | 257/558 |
| 5,175,607 | 12/1992 | Ikeda | 257/511 |
| 5,187,554 | 2/1993 | Miwa | 437/31 |
| 5,232,861 | 8/1993 | Miwa | 257/588 |
| 5,324,672 | 6/1994 | Anmo et al. | 437/31 |

OTHER PUBLICATIONS

"Vertical p–n–p for Complementary Bipolar Technology", Ingrid E. Magdo; (IEEE Journal of Solid State Circuits, vol. SC–15, No. 4, Aug. 1980).

"A sub–30psec Si Bipolar LSI Technology", Takayuki Gomi, et al.; (IEEE, International Electron Devices Meeting Technical Digest, pp. 744–747, Dec. 1988).

"An NPN 30GHz, PNP32GHz fT Complementary Bipolar Technology", Onai, et al. (IEEE, International Electron Devices Meeting Technical Digest, pp. 63–66; Dec. 1993).

"An NPN 30GHz, PNP 32 GHz ft Complementary Bipolar Technology"; Onai et al; (IEEE, IEDM 1993), Dec. 1993.

"Self–Aligned Complementary Bipolar Technology for Low–power . . . "; Onai et al; IEEE, vol. 42, No. 3, Mar. 1995.

"Process & Device Optimization of an Analog Complementary Bipolar IC . . . "; Yamaguchi et al; IEEE vol. 41, No. 6, Jun. 1994.

*Primary Examiner*—Wael Fahmy
*Attorney, Agent, or Firm*—Hill & Simpson

[57] ABSTRACT

A complementary bipolar transistor device, made of two separate conductive films such as two highly doped polysilicon films of opposite conductivity types. The doped polysilicon film is used for a base of NPN transistor and an emitter of a PNP transistor whereas the other doped polysilicon film is used for emitter of the NPN and a base of the PNP. The resulting base and emitter isolating structure is easy to fabricate, and self-aligned to the advantage of size reduction of individual devices.

13 Claims, 3 Drawing Sheets

STRUCTURE OF COMPLEMENTARY BIPOLAR TRANSISTORS

FIELD OF THE INVENTION

The present invention relates to a structure and fabrication process of a semiconductor device, and more specifically to a high performance complementary bipolar transistor.

BACKGROUND OF THE INVENTION

A complementary bipolar transistor device is attracting much attention as a device implementing an ultra high speed, low power consumption LSI (large scale integrated circuit). One conventional example is disclosed in "An NPN 30 GHz, PNP 32 GHz fT Complementary Bipolar Technology", Onai, et al. 1993 IEEE. In such a complementary bipolar device, the performance of the device is determined by the poorer of NPN and PNP transistors which is poorer in characteristic. It is, therefore, desirable to match the characteristics of both transistors with each other, and in the conventional example, the NPN and PNP transistors are arranged in a completely symmetrical configuration. However, the conventional device requires a step of separately forming a base polysilicon electrode and an emitter polysilicon electrode by ion implantation or the like. The conventional design is disadvantageous in the number of fabrication steps, TAT (Turn Around Time) and cost.

SUMMARY OF THE INVENTION

It is therefore an object of the present invention to reduce the number of required fabricating steps for a transistor device such as a complementary bipolar transistor device.

It is another object of the present invention to provide a process for fabricating a transistor device such as the complementary bipolar transistor device capable of operating at high speeds.

It is still another object of the present invention to provide a structure of a transistor device, such as the complementary bipolar transistor device, which can operate at high speeds and has a high fT (high cut off frequency).

A semiconductor device according to one aspect of the present invention includes at least first and second electrically conductive films which are electrically separated from each other; a first transistor using the first conductive film as a base electrode, and the second conductive film as an emitter electrode; and a second transistor using the first conductive film as an emitter electrode, and the second conductive film as a base electrode.

A semiconductor device according to another aspect of the present invention includes at least first and second electric conductive films which are electrically separated from each other; a first transistor having a portion of the second conductive film formed in an opening opened in the first conductive film; and a second transistor which includes a portion of the second conductive film located outside a portion of the first conductive film.

A semiconductor device according to still another aspect of the present invention includes at least first and second electric conductive films which are electrically separated from each other; a first transistor comprising a base electrode formed by the first conductive film, and an emitter electrode formed, by the second conductive film, in an opening formed in the base electrode; and a second transistor includes an emitter electrode formed by the first conductive film, and a base electrode formed, by the second conductive film, outside the emitter electrode of the second transistor.

According to another aspect of the present invention, a process wherein a step of forming a first insulating film on a semiconductor substrate, a step of forming a first opening in the first insulating film, a step of forming a first conductive film; a step of forming a second insulating film, a step of combining the second insulating film and the first conductive film to form a multi-layer film, a step of forming a second opening in a part of the multi-layer film, a step of forming a third insulating film on a side wall of the multi-level film structure of the second insulating film and the first conductive film, and on a side wall of the second opening, and a step of forming a second conductive film.

According to another aspect of the present invention, a process for fabricating a semiconductor device, includes a step of forming a first insulating film on a semiconductor substrate, a step of forming a first opening in the first insulating film, a step of forming a first conductive film, a step of forming a second insulating film, a step of combining the second insulating film and the first conductive film to form a multi-layer film, a step of forming a second opening in a part of the multi-layer structure of the second insulating film and the first conductive film, a step of forming a third insulating film on a side wall of the multi-level film structure of the second insulating film and the first conductive film, and on a side wall of the second opening, a step of forming a second conductive film, a step of forming a diffusion layer of a first conductivity type by using the first conductive film as a diffusion source, and a step of forming a diffusion layer of a second conductivity type by using the second conductive film as a diffusion source.

In the present invention, it is possible to form the base electrode of an NPN transistor and the emitter electrode of a PNP transistor from a single conductive film, and to form the emitter electrode of the same NPN transistor and the base electrode of the same PNP transistor from another single conductive film. Both single conductive films are layered upon one another so as to share a common semiconductor substrate. Therefore, the present invention can eliminate the necessity of a step for individually forming the separate base and emitter electrodes. Thus, the present invention can prevent an increase of the number of required fabrication steps, reduce TAT (Turn Around Time—a time required to supply products from a semiconductor maker to users), and to reduce the cost of the device. Moreover, the present invention makes it possible to achieve an isolation between the emitter and base both in the NPN and PNP transistors, for example, with the same dielectric side wall in a self alignment structure, so that further miniaturization is possible.

DETAILED DESCRIPTION OF THE INVENTION

FIGS. 1A–1H show a sequence of fabrication steps and a structure of a semiconductor device according to one embodiment of the present invention. Each of these figures shows a cross sectional structure of an upper part of a silicon substrate in and on which a bipolar NPN transistor 1 and an S-PNP transistor (Substrate PNP transistor)2 are formed. The structure at different stages of the process is shown in these figures.

Figure 1A:
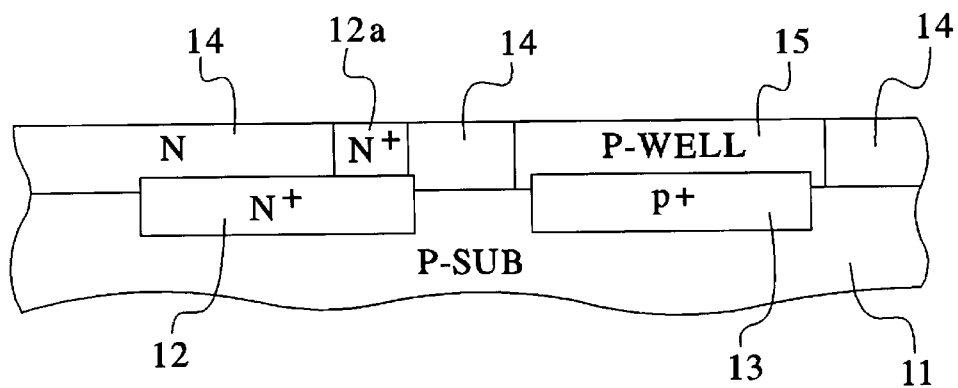
FIG. 1A, is schematic sectional views for showing a view of the present invention, and a structure of a complementary bipolar transistor device fabricated by the process of the present invention.

As shown in FIG. 1A, in a P-type substrate 11, a highly doped N+ type layer 12 and a highly doped P+-type layer 13 are formed by a known technique of solid phase diffusion, for example. Then, N+-type layer 12 and P-type layer 13 are buried under an N-type epitaxial layer 14. The epitaxial layer 14 of this example is formed by a technique of vapor phase N-type epitaxial growth. A substrate is composed of epitaxial layer 14 and P-type substrate 11. The epitaxial layer thickness of the N epitaxial layer 14 is preferably 0.5~1.0 μm. Thereafter, a P well 15 is formed by ion implantation in the N epitaxial layer 14 just above P+-type layer 13, and an N+ contact region 12a is formed in the N epitaxial layer 14 just above N+ type layer 12. The N epitaxial layer 14, in conjunction with N+ layer 12 and N+ contact region 12a, functions as a collector region (collector) of an NPN transistor 1, and the N+ region 12a serves as a collector contact region for the NPN transistor 1. P well 15, in conjunction with P+ type layer 13 and P+ contact region, serves as a collector region (collector) of a PNP transistor 2.

Figure 1B:
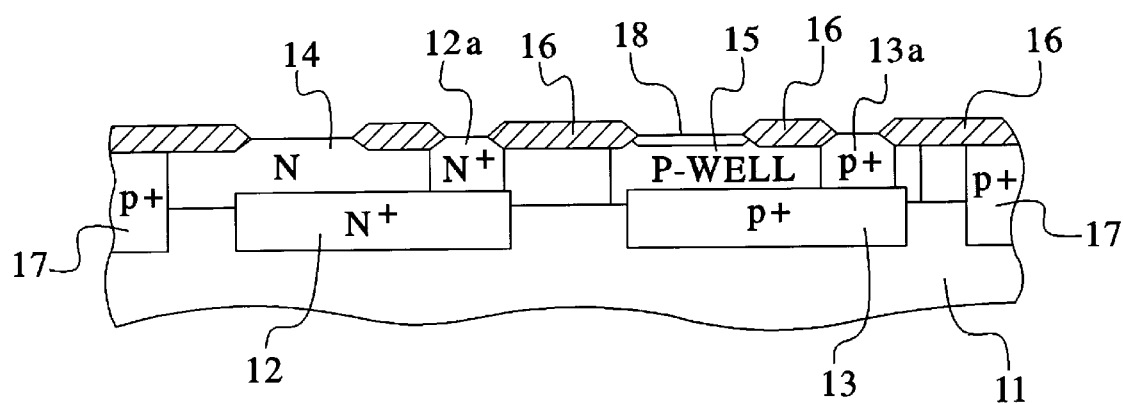
FIG. 1B, is schematic sectional views for showing a view of the present invention, and a structure of a complementary bipolar transistor device fabricated by the process of the present invention.

An insulating LOCOS oxide film 16 is formed on top of portions of epitaxial layer 14, N+ type Layer 12 and P well 15, as shown in FIG. 1B, for isolation between devices. The film thickness of the LOCOS oxide film 16 is preferably 400~800 nm in this example. Subsequently, one or more P+ isolation diffusion walls 17 are formed in the epitaxial layer 14 and the P– substrate 11, at selected locations directly under the oxide film 16. It is optional to form the P+ isolation walls 17 simultaneously with the P well 15, for example, by ion implantation of boron in an implantation energy range of 300~500 KeV and a dose range of $1\times10^{13}\sim1\times10^{14}$ cm$^{-2}$. In this case, it is possible simultaneously to form a P+ contact region 13a in the P well region 15, just above the P+-type layer 13. A base layer 18 is formed in an upper portion of P well 15 by ion implantation of phosphorus with the conditions of 50~200 KeV and $1\times10^{13}\sim1\times10^{14}$ cm$^{-2}$.

Figure 1C:
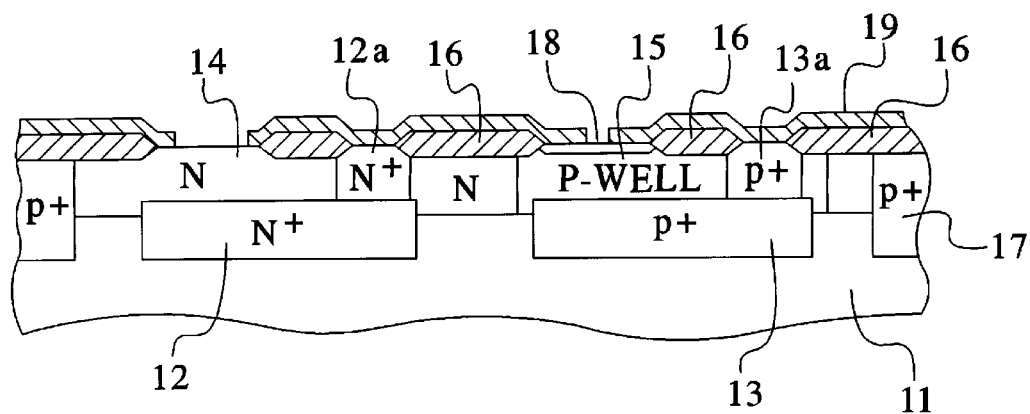
FIG. 1C, is schematic sectional views for showing a view of the present invention, and a structure of a complementary bipolar transistor device fabricated by the process of the present invention.

At a next step shown in FIG. 1C, an insulating film 19, made of SiO$_2$ preferably, and having a thickness of about 100 nm is formed on top of the exposed upper surface of the epitaxial layer 14 of substrate by CVD, LOCOS oxide film 16, N+ contact region 12a, P+ contact region 13a and base layer 18. Thereafter, openings (windows) are formed in the SiO$_2$ insulating film 19 by a known technique of dry etching to selectively expose a portion of epitaxial layer 14 and a portion of base layer 18.

Figure 1D:
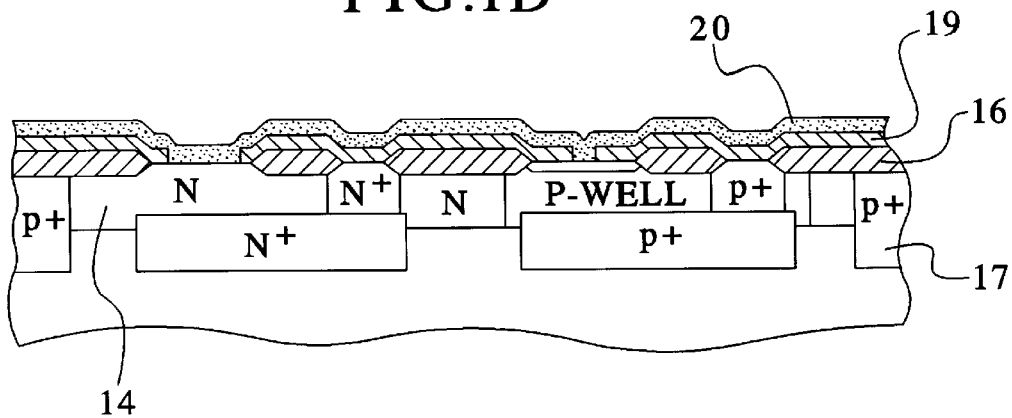
FIG. 1D, is schematic sectional views for showing a view of the present invention, and a structure of a complementary bipolar transistor device fabricated by the process of the present invention.

FIG. 1D shows a P$^+$-type polysilicon layer 20 formed/layered on top of the insulating film 19 and the exposed surfaces of epitaxial layer 14 and base layer 18 by CVD. The thickness of the polysilicon layer 20 is preferably 100~200 nm. The P$^+$ polysilicon layer 20 can be formed by ion-implanting boron or BF2 after a deposition of the polysilicon layer by CVD. Alternatively, the P$^+$ polysilicon layer 20 can be formed by CVD of in situ boron doped polysilicon.

Figure 1E:
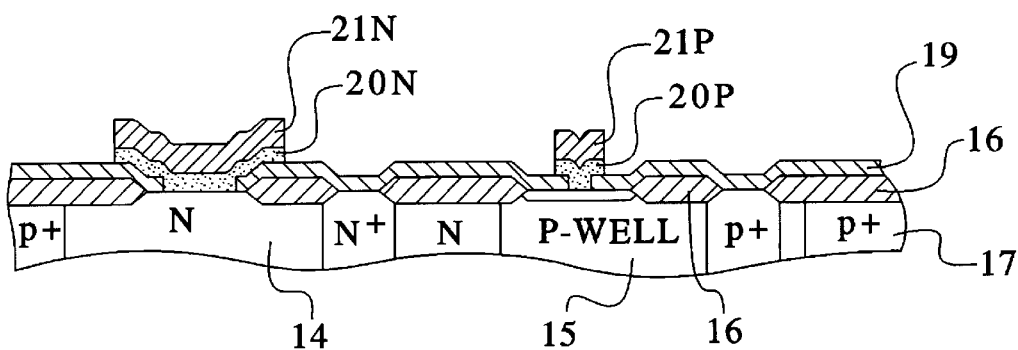
FIG. 1E, is schematic sectional views for showing a view of the present invention, and a structure of a complementary bipolar transistor device fabricated by the process of the present invention.

Then, a 200~400 nm thick insulating film 21, preferably of SiO$_2$, is formed on the polysilicon layer 20 by CVD. After that, the polysilicon layer 20 and the oxide layer 21 are selectively etched away by dry etching with a resist pattern, leaving a base electrode 20N of the NPN transistor 1 and an emitter electrode 20P of the PNP transistor 2, as shown in FIG. 1E.

Figure 1F:
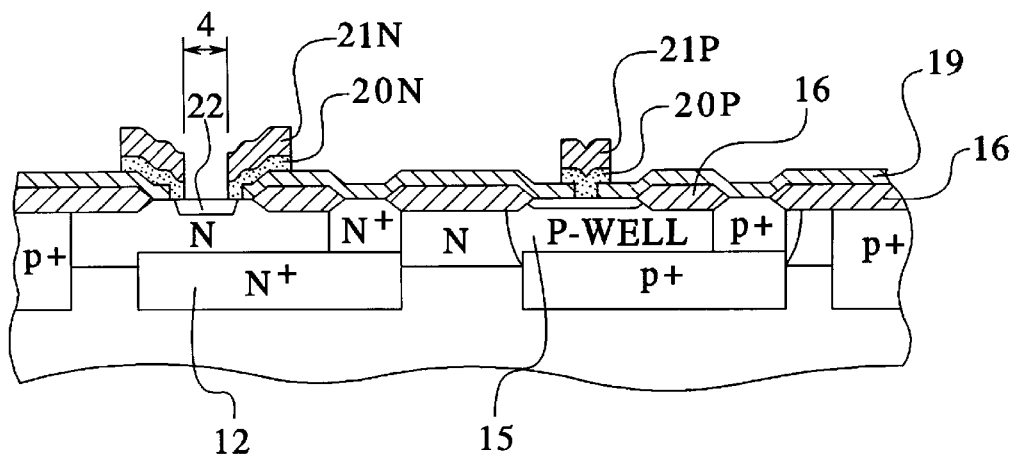
FIG. 1F, is schematic sectional views for showing a view of the present invention, and a structure of a complementary bipolar transistor device fabricated by the process of the present invention.

As shown in FIG. 1F, an opening 4 is formed by dry etching in the remaining polysilicon layer 20N and oxide layer 21N to selectively expose a center portion of the surface of epitaxial layer 14 (base/emitter forming region) of the NPN transistor 1. Next, an approximately 10~20 nm thick SiO$_2$ layer (not shown) is formed by CVD on the exposed surface portion of the epitaxial layer 14, and a base diffusion layer 22 is formed in an upper portion of the exposed surface of epitaxial layer 14 by ion implantation of BF$_2$ under the conditions of 10~60 KeV and $1\times10^{12}\sim1\times10^{14}$ cm$^{-2}$.

Figure 1G:
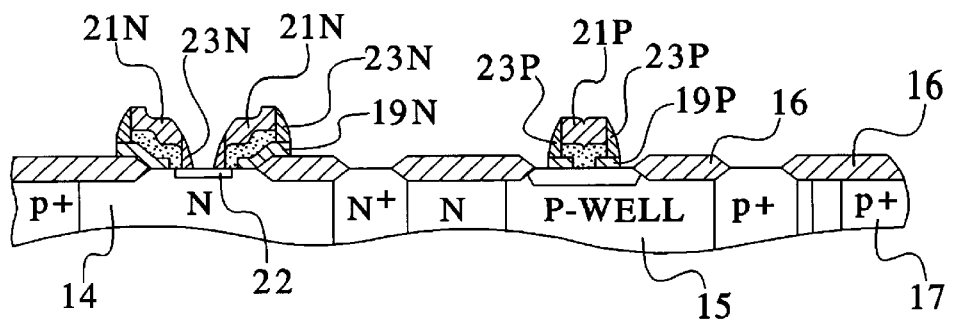
FIG. 1G, is schematic sectional views for showing a view of the present invention, and a structure of a complementary bipolar transistor device fabricated by the process of the present invention.

Then, as shown in FIG. 1G, side wall spacers 23 are formed for isolation between the emitter electrodes (24N, 20P) and base electrodes (20N, 24P), respectively, of the NPN transistor 1 and of the S-PNP transistor 2. These side wall spacers 23 are formed by depositing a 400~600 nm thick SiO$_2$ film by CVD, and etching anisotropically unwanted portions by dry etching. A portion of insulating film 19 is then removed to expose a portion of the surface of P Well 15/base layer 18. By the use of an etching technique having a high selectivity of SiO$_2$ relative to Si, an amount of etching of the SiO$_2$ insulating film 19 can be restrained in case of overetch.

Figure 1H:
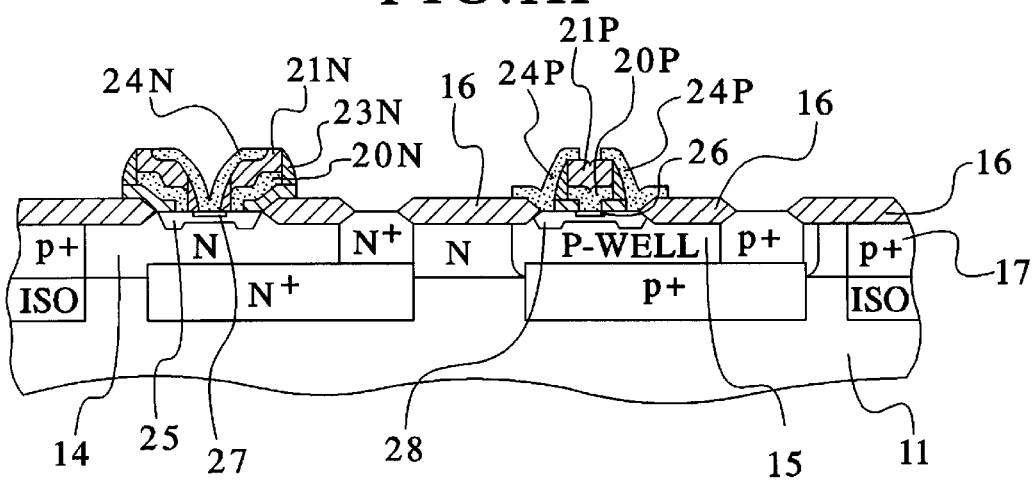
FIG. 1H, is schematic sectional views for showing a view of the present invention, and a structure of a complementary bipolar transistor device fabricated by the process of the present invention.

After that, an approximately 100~200 nm thick N$^+$ polysilicon film 24 is deposited on top of all exposed surfaces by CVD. The N$^+$ polysilicon film 24 can be formed by ion implantation of As, phosphorus after the deposition of a polysilicon film, or by polysilicon CVD with in situ phosphorus doping. Then, by processing the N$^+$ polysilicon film 24 by dry etching, predetermined sections of the N$^+$ polysilicon film 24 are left unetched so as to form two sections of film 24. One section, 24N, remains on a first structure as a part of NPN transistor 1 and a second section, 24P, remains on a second structure as a part of PNP transistor 2, as shown in FIG. 1H.

Then, a heat treatment of 900~1100° C. for 5 sec ~3.0 min is performed to cause impurities to diffuse from the P$^+$ polysilicon film 20 and the N$^+$ polysilicon film 24 into the silicon substrate. The diffusion from the P$^+$ polysilicon film 20N forms a base contact region 25 of the NPN transistor 1. The diffusion from the P$^+$ polysilicon film 20P forms an emitter region 26 of the PNP transistor 2. The diffusion from the N⁺ polysilicon film 24N forms an emitter region 27 of the NPN transistor 1 and the diffusion from the N⁺ polysilicon film 24P forms a base contact region 28 of the PNP transistor 2.

Figure 1I:
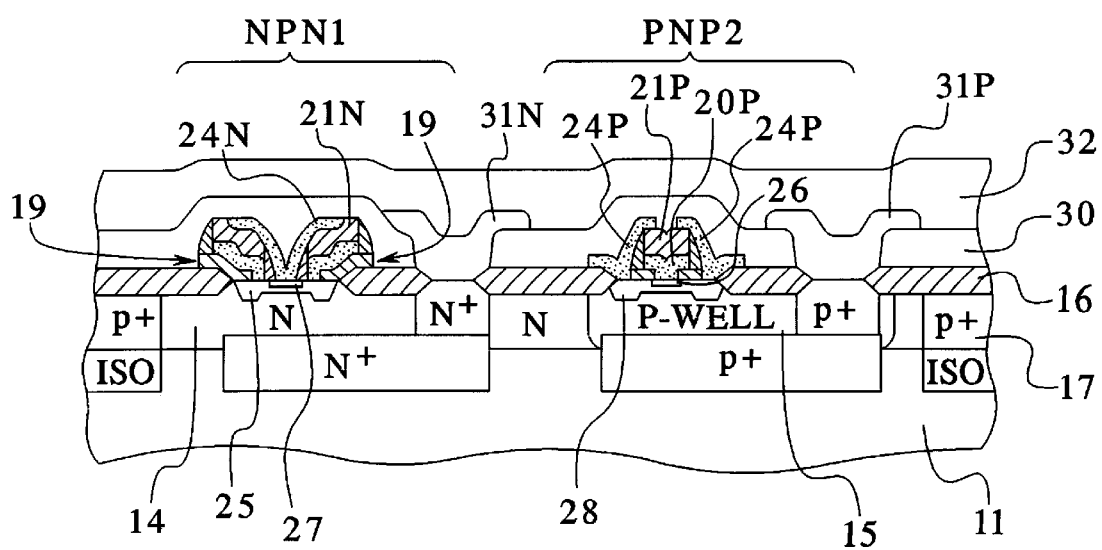
FIG. 1I, is schematic sectional views for showing a view of the present invention, and a structure of a complementary bipolar transistor device fabricated by the process of the present invention.

Next, by a known technique of interconnection, an electrode isolation film 30 and a collector electrode film 31 are formed on the exposed surfaces, and an etching operation follows. The result of these operations is an isolation film 30N and 30P and collector electrode films 31N and 31P. A complementary bipolar transistor structure, as shown in FIG. 1I, combining the NPN transistor 1 and PNP transistor 2 is thereby formed. Thereafter, an insulating film 32 is deposited on the top surface of the entire complementary bipolar transistor structure.

In this embodiment, the base electrode 20N of the NPN transistor 1 and the emitter electrode 20P of the PNP transistor 2 are formed by layering and selectively etching a single conductive film 20, and the emitter electrode 24N of the NPN transistor 1 and the base electrode 24P of the PNP transistor 2 are also formed by layering and selectively etching a second single conductive film 24. Therefore, it is not necessary to separate the base electrode and the emitter electrode by ion implantation or the like. Thus, this embodiment can simplify the fabricating process, reduce TAT and achieve cost reduction. Moreover, in both of the NPN transistor 1 and PNP transistor 2, the emitter-base isolation can be attained with the side walls of the same insulating film by the self alignment technique. The resulting self aligned structure can reduce the area of the bipolar device and facilitate device miniaturization.

According to one embodiment of the invention as explained above, a structure of a semiconductor device (such as a complementary Integrated circuit device) incorporates a semiconductor substrate which is made up of a P-type substrate (11) plus a an epitaxial layer (14) layered thereon. A NPN transistor 1 is formed on the semiconductor substrate in such a way that diffusion layer (22) composes a base region of the NPN transistor 1. An emitter region (27) of NPN transistor 1 is formed in the epitaxial layer 14 of semiconductor substrate so as to form a first transistor, such as an NPN transistor 1. A first active region, base region (18), and a second active region, emitter region 26, are formed in P Well 15 to form a second transistor (such as a PNP transistor 2);

first and second lower insulating sections of a lower insulating layer (such as oxide layer 19) or a combination of oxide layers (19 plus 16) formed by oxidation or deposition} formed on a selected portion of epitaxial layer 14, P well 15 and P+ region 17, a first and second lower conductive sections of a lower conductive layer {such as a heavily doped P⁺ polysilicon layer (20)} formed on the lower insulating layer (SiO2 film 19), said first and second lower conductive sections being formed, respectively, on the first and second lower insulating sections;

first and second upper insulating sections of an upper insulating layer {such as an oxide layer (21)} formed on the lower conductive layer (20), the first and second upper insulating sections being formed, respectively, on the first and second lower conductive sections; and first and second upper conductive sections of an upper conductive layer {such as a heavily doped N⁺ polysilicon layer (24)} formed on said upper insulating layer (21), the first and second upper conductive sections being formed, respectively, on the first and second upper insulating sections and insulated from the first and second lower conductive sections by the first and second upper insulating sections.

In this semiconductor device the left side section of the P⁺ polysilicon film 20 shown in FIG. 1F and the subsequent figures) is electrically connected to the first active region, P base region (22), of the NPN transistor 1) so that the first lower conductive section serves as a first electrode of the first transistor (such as the base electrode of the NPN transistor 1). The first upper conductive section of the upper conductive layer {such as the left side section of the N⁺ polysilicon film (24) shown in FIGS. 1H and 1I) is electrically connected with the second active region of the first transistor {such as the emitter region (27) of the NPN transistor 1} so that the first upper conductive section serves as a second electrode of the first {such as the emitter electrode of the NPN transistor 1). The second lower conductive section of said lower conductive layer {such as the right side section of the P⁺ polysilicon film (20) shown in FIG. 1F and the subsequent figures} is electrically connected with the second active region of the second transistor {such as the emitter region (26) of the PNP transistor 2} so that the second lower conductive section serves as a second electrode of the second transistor (such as the emitter electrode of the PNP transistor 2). The second upper conductive section of the upper conductive layer {such as the right side section of the N⁺ polysilicon film (24) shown in FIGS. 1H and 1I} is electrically connected with the first active region of the second transistor {such as the base region (18 as best shown in FIG. 1B) of the PNP transistor 2}, so that the second upper conductive section serves as a first electrode of the second transistor (such as the base electrode of the PNP transistor 2). The first active region (such as the base region) of each of the first and second transistors may comprise a more heavily doped contact subregion (such as a base contact subregion) and a more lightly doped proper base subregion. In this case, the first electrode (such as the base electrode) of each of the first and second transistor is in contact with the more heavily doped contact subregion, and electrically connected indirectly with the more lightly doped proper subregion through the contact subregion.

In this device, one of said first lower and upper conductive sections may comprise an inner opening, the other of the first lower and upper conductive sections may comprise a central subsection formed in the inner opening and put in direct contact with one of the first and second active regions of the first transistor, and one of the second lower and upper conductive sections may be located within the other of the second lower and upper conductive sections. In the illustrated example of the invention, the inner opening is formed in the first (left side) lower conductive section of the lower conductive layer (20) as shown in FIG. 1F and the subsequent figures, and the first (left side) upper conductive section of the upper conductive layer (24) comprises a central subsection which is formed in the inner opening, as shown in FIG. 1H and 1I. In the illustrated example, the first upper conductive section is surrounded by the first lower conductive section (at least partly), or the first upper conductive section is located between left and right portions of the first lower conductive section as viewed in a cross sectional view. On the other hand, the second lower conductive section is surrounded (at least partly) by the second upper conductive section or located between left and right portions of the second upper conductive section as viewed in a cross sectional view.

In the illustrated example, the left side section (the first lower insulating section) of the lower insulating layer (SiO2 film 19) comprises a portion defining a first opening as best shown in the left side of FIG. 1C; and the right side section (the second lower insulating section) of the lower insulating layer (19) comprises portion defining a second opening as best shown in the right side of FIG. 1C. In the illustrated example, the second opening is smaller in size than the first opening. The left side (first) lower conductive section (20) of the illustrated example comprises a lower subsection and an upper subsection. The lower subsection of the left side lower conductive section (20) is formed in the first opening of the first lower insulating section as shown in FIG. 1E and is formed with the inner opening as shown in FIG. 1F. The upper subsection of the left side lower conductive section (20) is formed on the first lower insulating section shown in FIGS. 1E and 1F. The left side (first) upper conductive section (24) comprises a central subsection and a peripheral subsection. The central subsection is formed in the inner opening of the first lower conductive section, and is separated laterally from the lower subsection of the first conductive section by a generally vertically extending dielectric side wall (23) formed between the lower subsection of the first lower conductive section (20) and the central subsection of the first upper conductive section (24). The peripheral subsection is vertically separated from the upper subsection of the first lower conductive section (20) by the first upper insulating section (21). The right side (second) lower conductive section (20) of the illustrate example comprises lower and upper subsections. The lower subsection of the right side lower conductive section (20) is formed in the second opening of the second lower insulating section (19), and the upper subsection is formed on the second lower insulating section (19). The right side (second) upper conductive section (24) comprises lower, middle and upper subsections. The lower subsection of the right side upper conductive section (24) is in contact with one of the active regions of the second transistor and is laterally separated from the lower subsection of the second lower conductive section (20) by the second lower insulating section (21). The middle subsection extends generally vertically from the lower subsection to the upper subsection, and is separated laterally from the upper subsection of the second lower conductive section (20) by a generally vertically extending dielectric side wall (23) formed between the middle subsection of the second upper conductive section (24) and the upper subsection of the second lower conductive subsection, (20). The upper subsection of the right side upper conductive section (24) is separated vertically from the upper subsection of the second lower conductive section (20) by the second upper insulating section (21).

The semiconductor substrate may further comprise a third active region of the first transistor or a first collector region (such as a region of the original material of the epitaxial layer 14) for the first transistor, and a third active region of the second transistor or a second collector region (such as the P well region 15 formed in the epitaxial layer 14) for the second transistor.

According to one of possible interpretation of the present invention as explained above, a fabricating process for a semiconductor device, comprises:

a first step of forming a lower insulating film (such as the items 19 and 16) on a first major (upper) surface of a semiconductor substrate (by oxidation and/or CVD, for example);

a second step of forming a first opening (such as the left side opening formed in the SiO$_2$ film 19 above the N$^+$ buried layer 12 to bare the N epitaxial layer 14 as shown in FIG. 1C) in the lower insulating film (by dry etching, for example);

a third step of forming a lower conductive film (such as the film 20 shown in FIG. 1D) on the lower insulating film and in the first opening (by CVD or by CVD plus ion implantation, for example);

a fourth step of forming an upper insulating film (such as the item 21) on the lower conductive film (by CVD, for example);

a fifth step of forming a first multi-layer section (such as the multi-layer structure of 20 and 21 shown in FIG. 1E or 1F) comprising a first lower conductive section of the lower conductive film (20) and a first upper insulating section of the upper insulating film (21) by selectively removing unwanted portions of the lower conductive film and the upper insulating film (by dry etching, for example);

a sixth step of forming a dielectric side wall (such as the side wall 23 shown in FIG. 1G) of the first multi-layer section (by CVD and anisotropic dry etching, for example);

a seventh step of forming a first upper conductive section of an upper conductive film (such as the film 24 shown in FIG. 1H) on the first multi-layer section (by CVD plus dry etching or CVD plus ion implantation plus dry etching, for example). In this process, the first and second conductive sections are formed so that one of the first lower and upper conductive sections is located inside, or surrounded by, the other.

In the illustrated example, the first (left side) multi-layer section formed by the fifth step has the inner opening defined by an inner side wall surface as shown in FIG. 1F, and an exterior boundary defined by an outer side wall surface as shown in FIGS. 1E and 1F. The outer side wall surface is covered with an outer dielectric side wall, and the inner side wall surface is covered with an inner dielectric side wall as shown in FIG. 1G.

The fabricating process may further comprise an eighth step of causing impurities to diffuse from the first lower and upper conductive sections into the semiconductor substrate, respectively (by heat treatment at 900~1100° C. for 5 sec~30 min, for example).

In the second step, a second opening may be formed in the lower insulating film (19) by etching, simultaneously with the first opening. In the fifth step, a second multi-layer section may be formed simultaneously with the first multi-layer section, by selectively etching unwanted portions of the lower conductive film and the upper insulating film away. The sixth step may comprise an operation for forming a dielectric side wall of the second multi-layer section simultaneously with the dielectric side wall of the first multi-layer section, and for forming, in the lower insulating film (19, 16), an outer opening located outside the second multi-layer section (so as to surround the second multi-layer section); and the seventh step may comprise an operation of forming a second upper conductive section of the upper conductive film (24) on the second multi-layer section and in the outer opening (as shown in FIG. 1H in the case of the illustrate example).

In view of the above description of the present invention, it will be appreciated by those skilled in the art that many variations modifications and changes can be made to the present invention without departing from the spirit or scope of the present invention as defined by the appended claims hereto. All such variations, modifications or changes are fully contemplated by the present invention.

What is claimed is:

1. A semiconductor device comprising:
a semiconductor base body including a semiconductor substrate having an epitaxial layer on a surface thereof and a LOCOS insulating film disposed on said epitaxial layer;

a first insulating layer disposed on said LOCOS insulating film and exposed surface portions of the semiconductor substrate;

a first polysilicon conductive film layered on said first insulating layer;

a second polysilicon conductive film layered over said first conductive film;

the first and second conductive films being electrically isolated from a each other;

a first transistor defined in said device comprising a base electrode and an emitter electrode;

the base electrode of the first transistor comprising said first conductive film, and the emitter electrode of the first transistor comprising said second conductive film;

a second transistor defined in said device comprising a base electrode and an emitter electrode;

the base electrode of the second transistor comprising said second conductive film and the emitter electrode of the second transistor comprising said first conductive film.

2. A semiconductor device as defined in claim 1, wherein
in the first transistor, a portion of said second conductive film is formed in an opening opened in said first conductive film; and in the second transistor, a portion of said second conductive film is located outside said first conductive film.

3. A semiconductor device as defined in claim 1 wherein said semiconductor substrate comprises a semiconductor base body including a semiconductor substrate having an epitaxial layer on a surface thereof and the first insulating layer is disposed on said epitaxial layer.

4. A semiconductor device as defined in claim 3 wherein said epitaxial layer comprises an N-type epitaxial layer.

5. A semiconductor device as defined in claim 3 further comprising a LOCOS insulating film disposed on said epitaxial layer and intermediate said epitaxial layer and said first insulating layer.

6. A semiconductor device comprising:

a semiconductor base body including a semiconductor substrate having an epitaxial layer on a surface thereof;

a first transistor comprising first and second active regions formed in the semiconductor substrate;

a second transistor comprising third and fourth active regions formed in said semiconductor substrate;

a LOCOS insulating film disposed on portions of the epitaxial layer and isolating the first transistor and the second transistor;

first and second lower insulating sections of a lower insulating layer formed on an upper surface of said LOCOS insulating film and exposed portions of said semiconductor substrate;

first and second lower conductive regions of a polysilicon lower conductive layer formed on said lower insulating layer, said first and second lower conductive sections being formed, respectively, on said first and second lower insulating sections;

first and second upper insulating sections of an upper insulating layer formed on said lower conductive layer, said first and second upper insulating sections being formed, respectively, on said first and second lower conductive sections; and first and second upper conductive sections of an upper conductive layer formed on said upper insulating layer, said first and second upper conductive sections being formed, respectively, on said first and second upper insulating sections and insulated from said first and second lower conductive sections;

wherein said first lower conductive section of said lower conductive layer is a first electrode of said first transistor and is electrically connected with said first active region, said first upper conductive section of said upper conductive layer is a second electrode of said first transistor and is electrically connected with said second active region of said first transistor, said second lower conductive section of said lower conductive layer comprises a second electrode of said second transistor, and is electrically connected with said third active region of said second transistor, and said second upper conductive section of said upper conductive layer is a first electrode of said second transistor and is electrically connected with said fourth active region of said second transistor.

7. A semiconductor device according to claim 6 wherein:

each of said first and second transistors comprise a bipolar transistor;

said third and fourth active regions of said first transistor comprise, respectively, first base and emitter regions for said first transistor;

said first and second electrodes of said first transistors comprise, respectively, first base electrode and first emitter electrode of said first transistor;

said first and second active regions of said second transistor comprise, respectively, second base and emitter regions for said second transistor; and said first and second electrodes of said second transistor comprise, respectively, second base and emitter electrodes for said second transistor.

8. A semiconductor device according to claim 7 wherein:

said first transistor comprises an NPN transistor, said second transistor comprises a PNP transistor; and said first and second transistors form a complementary bipolar device.

9. A semiconductor device according to claim 8 wherein:

one of said lower and upper conductive layers comprises a P-type polysilicon layer; and the other of said lower and upper conductive layers comprises an N-type polysilicon layer.

10. A semiconductor device according to claim 6, wherein:

said first lower conductive section of said first conductive layer has a first inner opening formed therein;

said first upper conductive section of said second conductive layer comprising a central subsection formed in said inner opening and connected contiguously with one of said first and second active regions of said first transistor; and said second lower conductive section of said first conductive layer is located within a second opening provided in said second upper conductive section of said second conductive layer.

11. A semiconductor device according to claim 10, wherein:

said first lower insulating section of said lower insulating layer is formed with a first opening therein;

said second lower insulating section of said lower insulating layer is formed with a second opening;

said first lower conductive section of the first conductive layer comprises a lower subsection which is formed in said first opening of said first lower insulating section and which is formed with said first inner opening;

an upper subsection formed on said first lower insulating section;

said central subsection of said first upper conductive section being separated laterally from said lower subsection of said first conductive section by a dielectric side wall formed between said lower subsection of said first lower conductive section and said central subsection of said first upper conductive section;

a peripheral subsection which is vertically separated from said upper subsection of said first lower conductive section by said first upper insulating section;

said second lower conductive section comprises a lower subsection formed in said second opening of said second lower insulating section;

an upper subsection formed on said second lower insulating section;

said second upper conductive section comprises a lower subsection which is in contact with one of said active regions of said second transistor and which is laterally separated from said lower subsection of said second lower conductive section by said second lower insulating section;

a middle subsection which is separated laterally from said upper subsection of said second lower conductive section by a dielectric side wall formed between said middle subsection of said second upper conductive section and said upper subsection of said second lower conductive subsection; and an upper subsection which is separated vertically from said upper subsection of said second lower conductive section by said second upper insulating section.

12. A semiconductor device according to claim 11 wherein:

said first upper conductive section is surrounded by said first lower conductive section;

said second lower conductive section is surrounded by said second upper conductive section; and said device further comprises first and second sections of a third insulating film formed on said upper conductive film, and first and second sections of a third conductive film formed on said third insulating film, a third active region of said first transistor electrically connected with said first section of said third conductive film and a third active region of said second transistor connected with said second section of said third conductive film.

13. A semiconductor device according to claim 12 wherein:

said lower conductive film comprises a highly doped polycrystalline semiconductor film of a second conductivity type;

said upper conductive film comprises a highly doped polycrystalline semiconductor film of a first conductivity type;

one of said first and second transistors comprises an NPN transistor and the other of said first and second transistors comprises a PNP transistor;

said first, second and third active regions of each of said first and second transistors comprise, respectively, base, emitter and collector regions formed in said semiconductor substrate;

said base region of said first transistor is formed in said collector region of said first transistor and extends into said collector region of said first transistor from said upper surface of said semiconductor substrate;

said emitter region of said first transistor is formed in said base region of said first transistor and extends into said base region of said first transistor from said upper surface of said semiconductor substrate;

said base region of said second transistor is formed in said collector region of said second transistor and extends into said collector region of said second transistor from said upper surface of said semiconductor substrate;

said emitter region of said second transistor is formed in said base region of said second transistor and extends into said base region of said second transistor from said upper surface of said semiconductor substrate;

said emitter region of said first transistor is formed underneath said central subsection of said first upper conductive section;

a base contact region is formed, underneath said central subsection of said first lower conductive subsection, in said base region of said first transistor;

said emitter region of said second transistor is located underneath said lower subsection of said second lower conductive section;

a base contact region is formed, underneath said lower subsection of said second upper conductive section, in said base region of said second transistor; and said device further comprises a first highly doped buried layer of said first conductivity type formed between said first collector region and an underlying layer of said second conductivity type, and a second highly doped buried layer of said second conductivity type formed between said second collector region and said underlying layer, a highly doped first collector contact region of said first conductivity type extending underneath said collector electrode to said first buried layer, and a highly doped second collector contact region of said second conductivity type extending underneath said second collector electrode to said second buried layer.

* * * * *